United States Patent
Ando et al.

(10) Patent No.: US 7,345,477 B1
(45) Date of Patent: Mar. 18, 2008

(54) MAGNETIC DETECTION DEVICE INCLUDING RESISTANCE ADJUSTING UNIT

(75) Inventors: Hideto Ando, Niigata-ken (JP); Kiyoshi Sato, Niigata-ken (JP); Hiroyuki Nakada, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/678,846

(22) Filed: Feb. 26, 2007

(30) Foreign Application Priority Data

Sep. 11, 2006 (JP) .............................. 2006-245420

(51) Int. Cl.
*G01R 33/02* (2006.01)
*H01L 29/82* (2006.01)

(52) U.S. Cl. ................. 324/252; 324/207.21; 324/249; 257/427

(58) Field of Classification Search ................ 324/252, 324/249, 207.11, 207.13, 207.18, 207.19, 324/207.21; 257/414, 421, 427
See application file for complete search history.

(56) References Cited

U.S. PATENT DOCUMENTS 6,222,361 B1 * 4/2001 Shimano et al. ....... 324/207.21
6,452,382 B1 * 9/2002 Tokunaga et al. ...... 324/207.21

FOREIGN PATENT DOCUMENTS

| JP | 2001-35702 | 2/2001 |
| JP | 2001-44001 | 2/2001 |

* cited by examiner

*Primary Examiner*—Bot LeDynh
(74) *Attorney, Agent, or Firm*—Brinks Hofer Gilson & Lione (57) ABSTRACT

In a magnetic detection device for obtaining an output from between a variable resistance element using the magnetoresistance effect and a reference resistance element, a balance between resistance values in the device can be easily adjusted in a wide range. A voltage is applied to a resistance adjusting unit, a reference resistance element, and a variable resistance element, which are serially connected, and is also applied to another variable resistance element, another reference resistance element, and another resistance adjusting unit, which are serially connected. When subjected to a magnetic field of a predetermined size, resistance values of the variable resistance elements change, and as a result, the potentials of output terminals change. Each of the resistance adjusting units includes serially connected parallel portions each including a plurality of parallel connected resistance elements. The resistance value of the resistance adjusting unit can be changed by bringing one of the parallel connected resistance elements into a non-conduction state.

5 Claims, 5 Drawing Sheets

FIG. 5
RESISTANCE VALUE ADJUSTMENT COMBINATIONS

TRIMMED PARTS

| ADJUSTMENT AMOUNTS | R1 5Ω | R2 10Ω | R3 20Ω | R4 40Ω | R5 80Ω | R6 160Ω |
|---|---|---|---|---|---|---|
| 5 | O | | | | | |
| 10 | | O | | | | |
| 15 | O | O | | | | |
| 20 | | | O | | | |
| 25 | O | | O | | | |
| 30 | | O | O | | | |
| 35 | O | O | O | | | |
| 40 | | | | O | | |
| 45 | O | | | O | | |
| 50 | | O | | O | | |
| 55 | O | O | | O | | |
| 60 | | | O | O | | |
| 65 | O | | O | O | | |
| 70 | | O | O | O | | |
| 75 | O | O | O | O | | |
| 80 | | | | | O | |
| 85 | O | | | | O | |
| 90 | | O | | | O | |
| 95 | O | O | | | O | |
| 100 | | | O | | O | |
| 105 | O | | O | | O | |
| 110 | | O | O | | O | |
| 115 | O | O | O | | O | |
| 120 | | | | O | O | |
| 125 | O | | | O | O | |
| 130 | | O | | O | O | |
| 135 | O | O | | O | O | |
| 140 | | | O | O | O | |
| 145 | O | | O | O | O | |
| 150 | | O | O | O | O | |
| 155 | O | O | O | O | O | |
| 160 | | | | | | O |
| 165 | O | | | | | O |
| 170 | | O | | | | O |
| 175 | O | O | | | | O |
| 180 | | | O | | | O |
| 185 | O | | O | | | O |
| 190 | | O | O | | | O |
| 195 | O | O | O | | | O |
| 200 | | | | O | | O |
| 205 | O | | | O | | O |
| 210 | | O | | O | | O |
| 215 | O | O | | O | | O |
| 220 | | | O | O | | O |
| 225 | O | | O | O | | O |
| 230 | | O | O | O | | O |
| 235 | O | O | O | O | | O |
| 240 | | | | | O | O |
| 245 | O | | | | O | O |
| 250 | | O | | | O | O |
| 255 | O | O | | | O | O |
| 260 | | | O | | O | O |
| 265 | O | | O | | O | O |
| 270 | | O | O | | O | O |
| 275 | O | O | O | | O | O |
| 280 | | | | O | O | O |
| 285 | O | | | O | O | O |
| 290 | | O | | O | O | O |
| 295 | O | O | | O | O | O |
| 300 | | | O | O | O | O |
| 305 | O | | O | O | O | O |
| 310 | | O | O | O | O | O |
| 315 | O | O | O | O | O | O |

MAGNETIC DETECTION DEVICE INCLUDING RESISTANCE ADJUSTING UNIT

This patent document claims the benefit of Japanese Patent Application No. 2006-245420 filed on Sep. 11, 2006, which is hereby incorporated by reference.

BACKGROUND

1. Field

The present embodiments relate to a magnetic detection device for detecting an external magnetic field by detecting a change of the resistance value of the device, and in particular, an object of the present invention is to provide a magnetic detection device having highly accurate magnetic detection by adjusting the resistance value.

2. Description of the Related Art

Usually, to detect a change of an external environment by using a variable resistance element whose resistance value is changed by the external environment, the variable resistance element is connected in series to a reference resistance element whose resistance value does not change, and the thus serially connected variable resistance element and reference resistance element are subjected to a direct current voltage. Then, a midpoint potential between the variable resistance element and the reference resistance element is detected. Thereby, the change of the resistance value of the variable resistance element can be accurately detected without being affected by the environmental temperature.

In this type of magnetic detection device, it is necessary to adjust the midpoint potential between the variable resistance element and the reference resistance element by adjusting the resistance value of the reference resistance element. The midpoint potential is preferably set to be one half the value of a power supply voltage.

As described in Japanese Unexamined Patent Application Publication Nos. 2001-35702 and 2001-44001, a conventional method of adjusting the resistance value is performed by forming a resistance element on a substrate and thereafter removing a part of the resistance element through trimming.

In the resistance value adjusting method described in the above publications, resistive films formed into square frames are partially removed. However, the resistive films positioned on the respective sides of each of the squares all have the same resistance value. Thus, when any one of the resistive films is trimmed, the amount of change of the overall resistance value is small. It is therefore difficult to obtain a wide adjustment range of the resistance value.

Further, to obtain the wide adjustment range of the resistance value, it is necessary to provide a large number of the square frames formed by the resistive films, as described in Japanese Unexamined Patent Application Publication No. 2001-44001. Furthermore, to trim the resistive films, it is necessary to calculate the positions of the resistive films to be removed by using a complicated formula. As a result, the structure of the resistive films for adjusting the resistance value becomes complicated, and the adjustment operation of the resistance value also becomes complicated.

SUMMARY

In light of the above-described problems associated with conventional techniques, it is an object of the present invention to provide a magnetic detection device capable of obtaining a wide adjustment range of the resistance value and permitting easy adjustment of the resistance value.

The present invention provides a magnetic detection device in which a variable resistance element having an electrical resistance changed by an external magnetic field and a reference resistance element having an electrical resistance not changed by the external magnetic field, are serially connected to each other and applied with a direct current voltage to detect a midpoint potential between the variable resistance element and the reference resistance element. In the magnetic detection device, at least one of the variable resistance element and the reference resistance element are serially connected to a resistance adjusting unit including a plurality of serially connected parallel portions, each of which includes a plurality of parallel connected resistance elements, and which are different from one another in combined resistance value. The sum of the combined resistance values of the resistance adjusting unit is adjusted by bringing any one of the resistance elements into a non-conduction state.

In the magnetic detection device according to the present invention, the plurality of the parallel portions are connected in series and are different from one another in combined resistance value. Therefore, the sum of the combined resistance values of the resistance adjusting unit can be changed in a wide adjustment range by selecting a resistance element of any one of the parallel portions and bringing the resistance element into a non-conduction state.

In a later-described embodiment of the present invention, two resistance elements are connected in parallel in each of the parallel portions. Alternatively, three or more resistance elements may be connected in parallel in each of the parallel portions. In this case, it is possible to perform such an adjustment that the resistance elements included in one parallel portion excluding one of the resistance elements are all brought into the non-conduction state.

In the present invention, it is preferable, for example, that the resistance adjusting unit includes a plurality of resistive layers extending parallel to one another and connected to one another by conductive layers at a plurality of positions, and that parts of the resistive layers sandwiched by an adjacent pair of the conductive layers form the resistance elements forming one of the parallel portions. It is preferable that the parallel portions are made different from one another in combined resistance value by differently setting intervals between the conductive layers, and that the sum of the combined resistance values of the resistance adjusting unit is adjusted by disconnecting the resistance element at a position between the adjacent pair of the conductive layers.

In the above-described configuration, the resistance adjusting unit can be easily formed by forming the resistive layers extending parallel to one another and by establishing conduction between the resistive layers at the plurality of positions by using the plurality of the conductive layers. Further, the combined resistance values of the respective parallel portions can be individually set by varying the intervals between the conductive layers.

In the present invention, it is preferable, for example, that the variable resistance element is a magnetoresistance effect element, and that each of the resistive layers forming the resistance adjusting unit is formed by the same film materials as film materials forming the magnetoresistance effect element, and is determined in lamination order of the film materials to prevent the resistance value thereof from being changed by the external magnetic field.

If the resistance adjusting unit is formed by the same materials as the materials forming the variable resistance element, it is possible to equalize a characteristic change caused by a temperature change between the resistance elements of the resistance adjusting unit and the variable resistance element.

In the present invention, it is preferable, for example, that each of the parallel portions is configured such that the plurality of resistance elements included therein are the same in resistance value, and that the combined resistance value thereof is increased in a phased manner in the serial direction of the resistance adjusting unit. Thus configured, the degree of adjustment can be accurately recognized in the adjustment of the resistance value of the resistance adjusting unit.

In the above case, it is preferable in the present invention that the combined resistance value of one of a pair of the parallel portions adjacent to each other in the serial direction is twice as great as the combined resistance value of the other one of the pair.

With the combined resistance value thus set to be doubled from one of the adjacent pair of the parallel portions to the other one of the pair, the adjustment range of the resistance value adjusted by the resistance adjusting unit can be increased by bringing any one of the resistance elements into the non-conduction state. Further, the resistance value changed by the adjustment can be accurately recognized.

According to the present invention, the resistance value can be easily adjusted, and a wide adjustment range of the resistance value can be obtained. Accordingly, a good balance can be set between the resistance value of the variable resistance element and the resistance value of the reference resistance element connected in series to the variable resistance element.

DETAILED DESCRIPTION

Figure 1:
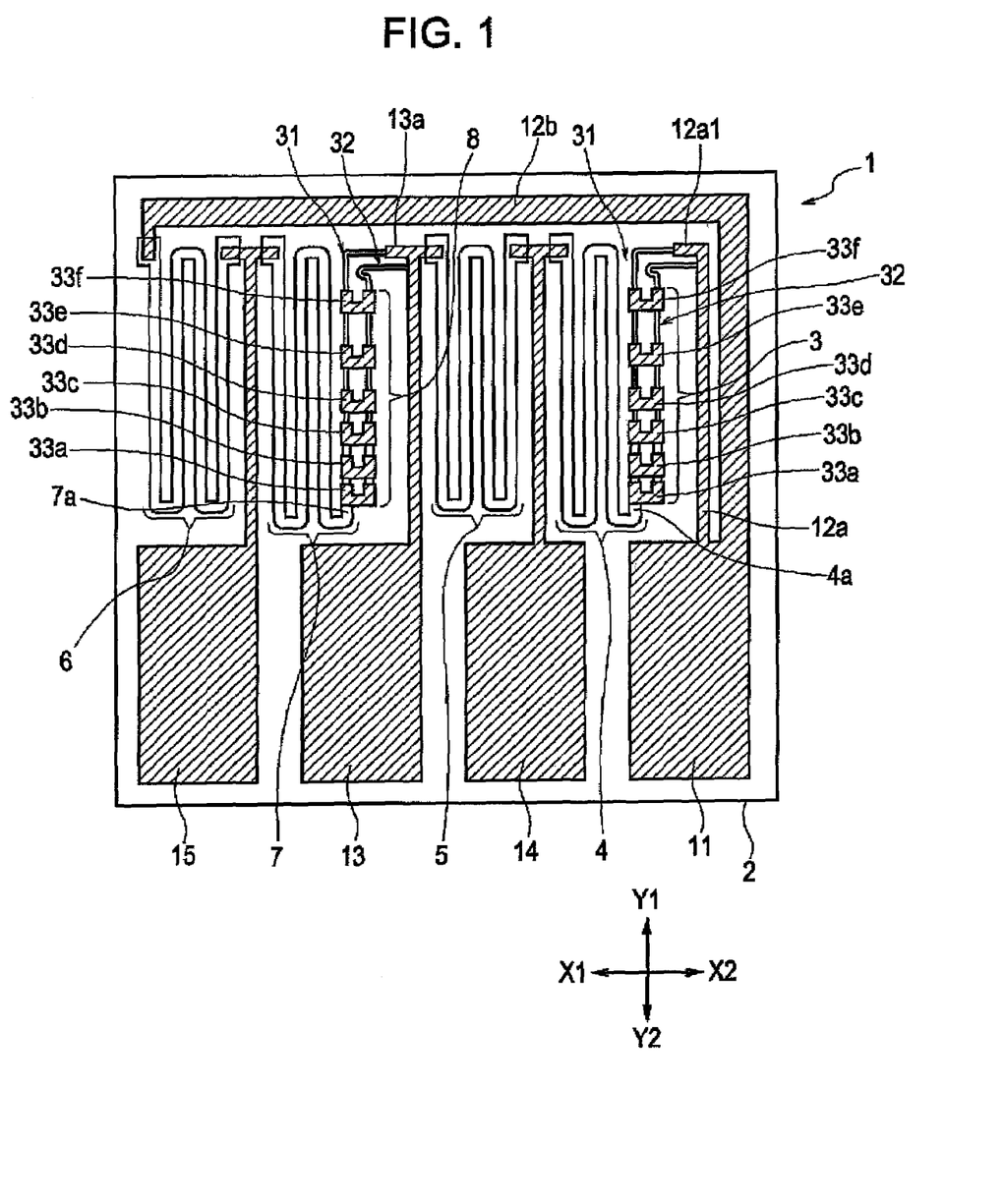
FIG. 1 is a plan view illustrating a magnetic detection device according to an embodiment of the present invention.
Figure 2A:
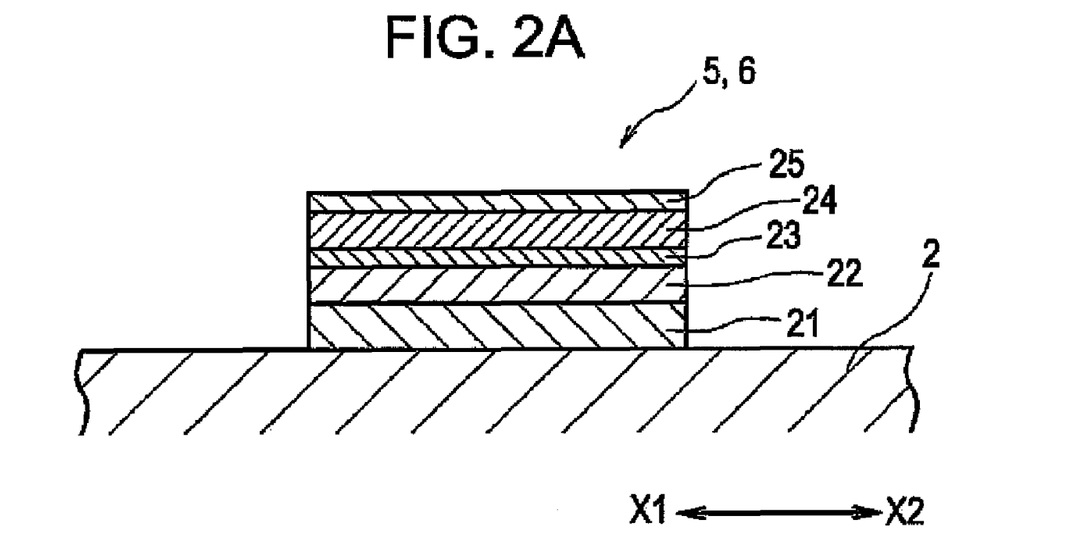
FIG. 2A is a cross-sectional view of a variable resistance element.
Figure 2B:
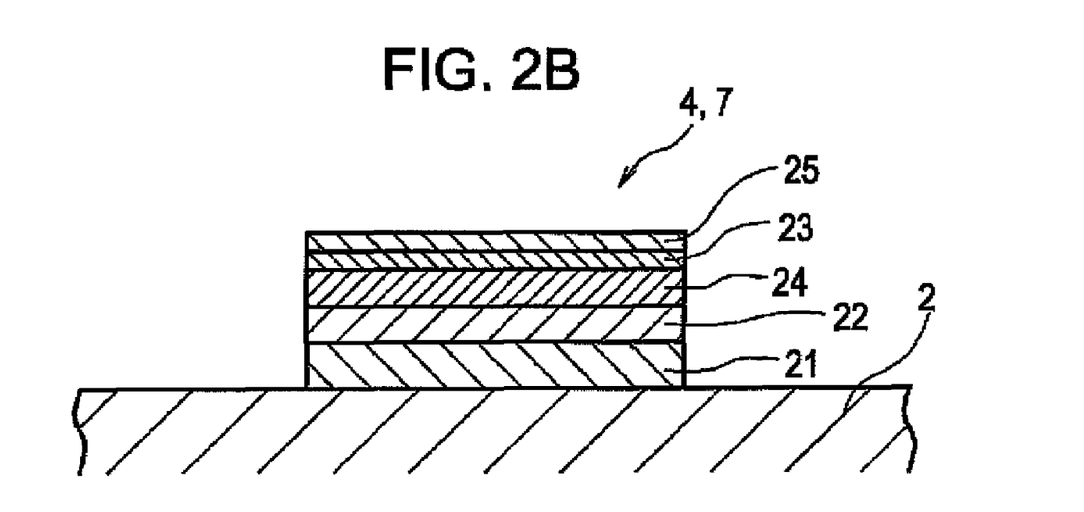
FIG. 2B is a cross-sectional view of a reference resistance element.
Figure 3:
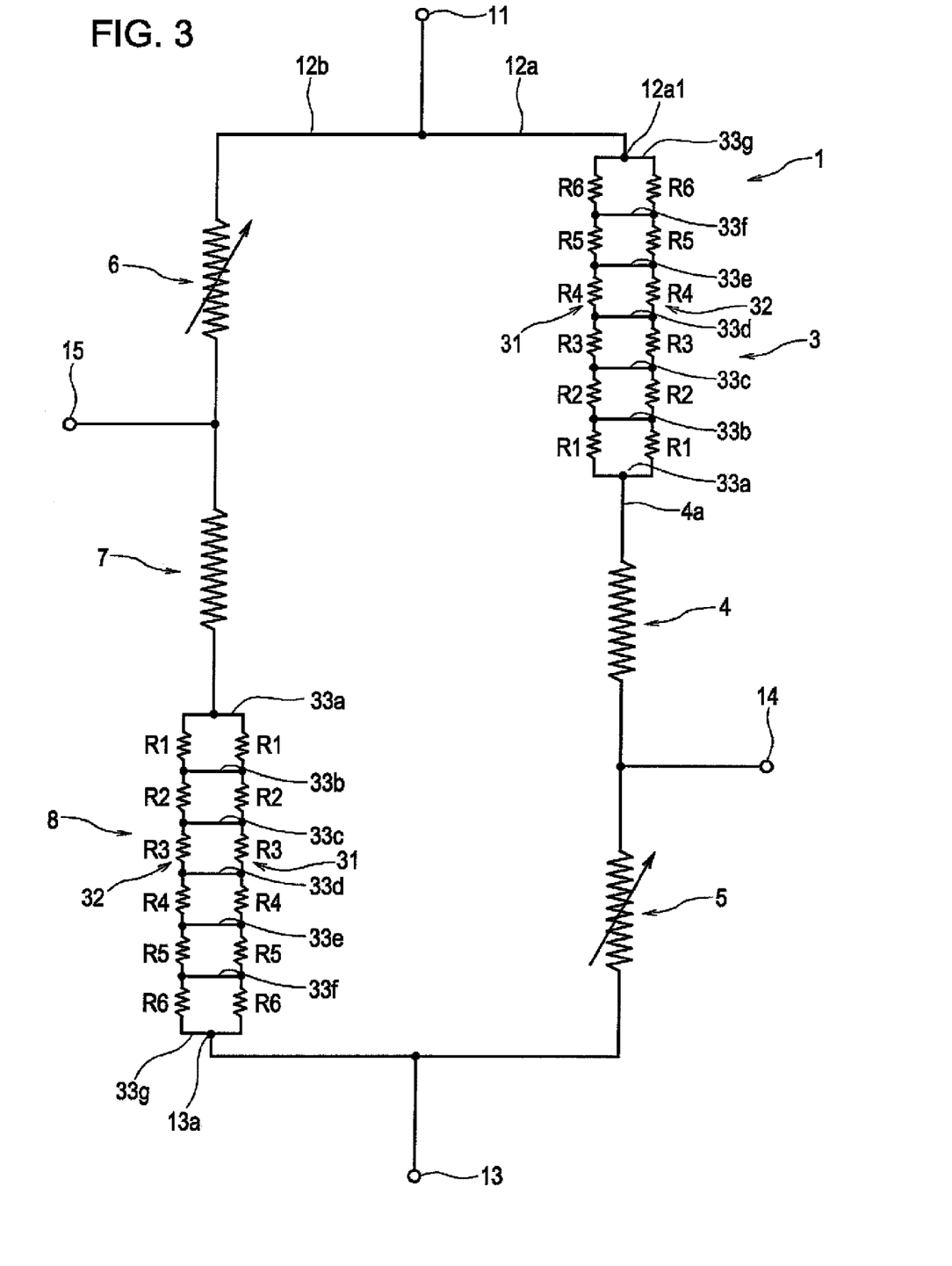
FIG. 3 is a circuit diagram of the magnetic detection device.
Figure 4:
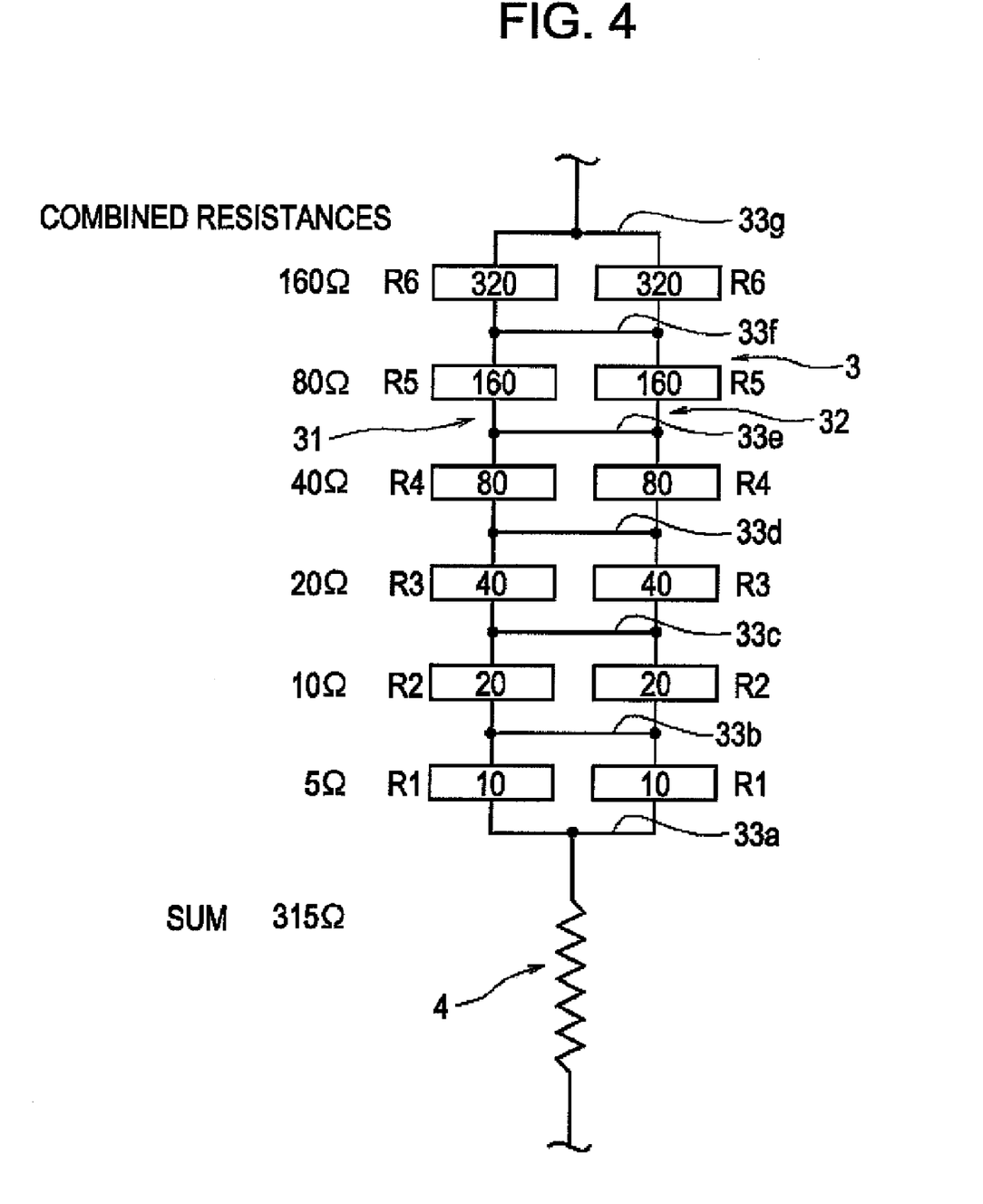
FIG. 4 is a circuit diagram illustrating a resistance adjusting unit.

FIG. 1 is a plan view of a magnetic detection device according to an embodiment of the present invention. FIG. 2A is a cross-sectional view of a variable resistance element, and FIG. 2B is a cross-sectional view of a reference resistance element. FIG. 3 is a circuit diagram of the magnetic detection device shown in FIG. 1. FIG. 4 is a circuit diagram illustrating details of a resistance adjusting unit.

A magnetic detection device 1 is formed on a surface of a substrate 2 by a thin film process. As illustrated in the circuit diagram of FIG. 3, the magnetic detection device 1 includes a first resistance adjusting unit 3, a first reference resistance element 4, a first variable resistance element 5, a second variable resistance element 6, a second reference resistance element 7, and a second resistance adjusting unit 8.

As illustrated in FIG. 1, the surface of the substrate 2 is provided with a power supply terminal 11. The power supply terminal 11 is connected to one end of the first resistance adjusting unit 3 via a lead layer 12a and to one end of the second variable resistance element 6 via a lead layer 12b.

The first resistance adjusting unit 3, the first reference resistance element 4, and the first variable resistance element 5 are connected in series, and the other end of the first variable resistance element 5 is connected to an earth terminal 13. Meanwhile, the second variable resistance element 6, the second reference resistance element 7, and the second resistance adjusting unit 8 are connected in series, and the other end of the second resistance adjusting unit 8 is connected to the earth terminal 13. Further, a connection midpoint between the first reference resistance element 4 and the first variable resistance element 7 is connected to a first output terminal 14. Meanwhile, a connection midpoint between the second variable resistance element 6 and the second reference resistance element 7 is connected to a second output terminal 15.

FIG. 2A is the cross-sectional view illustrating the first variable resistance element 5 and the second variable resistance element 6 cut along a plane extending in the directions of X1 and X2. The first variable resistance element 5 and the second variable resistance element 6 are the same in lamination structure.

Each of the first variable resistance element 5 and the second variable resistance element 6 is a magnetoresistance effect element using the giant magnetoresistance effect. The magnetoresistance effect element is formed into a film, with an antiferromagnetic layer 21, a fixed magnetic layer 22, a nonmagnetic conductive layer 23, and a free magnetic layer 24 laminated on the substrate 2, in this order. A surface of the free magnetic layer 24 is covered by a protective layer 25.

The antiferromagnetic layer 21 is formed of an antiferromagnetic material such as an Ir—Mn alloy (an iridium-manganese alloy). The fixed magnetic layer 22 is formed of a soft magnetic material such as a Co—Fe alloy (a cobalt-iron alloy). The nonmagnetic conductive layer 23 is formed of Cu (copper), for example. The free magnetic layer 24 is formed of a soft magnetic material such as a Ni—Fe alloy (a nickel-iron alloy). The protective layer 25 is a layer formed of Ta (tantalum).

In each of the first variable resistance element 5 and the second variable resistance element 6, the magnetization direction of the fixed magnetic layer 22 is fixed due to the antiferromagnetic coupling between the antiferromagnetic layer 21 and the fixed magnetic layer 22. In the present embodiment, the magnetization direction of the fixed magnetic layer 22 is directed and fixed in the direction of X2. Further, the fixed magnetic layer 22 and the free magnetic layer 24 are magnetically coupled to each other with the interposition of the nonmagnetic conductive layer 23. Thus, when there is no action by an external magnetic field, the magnetization direction of the free magnetic layer 24 is directed and stabilized in the direction of X2.

As illustrated in FIG. 1, each of the first variable resistance element 5 and the second variable resistance element 6 has an elongated shape, and the width-to-length aspect ratio of the element is 1 to approximately 50 to 120. Further, the planar pattern of each of the first variable resistance element 5 and the second variable resistance element 6 is in a meandering or serpentine shape, and the most part of the planar pattern extends in the directions of Y1 and Y2, i.e., the directions perpendicular to the fixing direction of the magnetization of the fixed magnetic layer 22. Since each of the first variable resistance element 5 and the second variable resistance element 6 has the elongated shape extending mainly in the directions of Y1 and Y2, the base resistance value of the element is set to be high.

In each of the first variable resistance element 5 and the second variable resistance element 6, when there is no action by the external magnetic field, the fixing direction of the magnetization of the fixed magnetic layer 22 and the magnetization direction of the free magnetic layer 24 both correspond to the direction of X2. Therefore, the electrical resistance value of the element is minimized. If a magnet or the like approaches in the direction of X1 to provide the magnetic detection device 1 with a magnetic field directed in the direction of X1, and if the strength of the magnetic field is increased to a predetermined amount, the magnetization direction of the free magnetic layer 24 is directed to the direction of X1. In this case, the fixing direction of the magnetization of the fixed magnetic layer 22 corresponds to the direction of X2, and thus the electrical resistance value of each of the first variable resistance element 5 and the second variable resistance element 6 is maximized.

FIG. 2B is the cross-sectional view illustrating the first reference resistance element 4 and the second reference resistance element 7 cut along a plane extending in the directions of X1 and X2. The first reference resistance element 4 and the second reference resistance element 7 are the same in lamination structure. Similar to the first variable resistance element 5 and the second variable resistance element 6, the first reference resistance element 4 and the second reference resistance element 7 have a multilayer structure. The first reference resistance element 4 and the second reference resistance element 7 are the same as the first variable resistance element 5 and the second variable resistance element 6 in terms of materials and thicknesses of the respective layers forming the elements. However, the lamination order of the nonmagnetic conductive layer 23 and the free magnetic layer 24 is opposite between the first and second reference resistance elements 4 and 7 and the first and second variable resistance elements 5 and 6. In the layer structure of each of the reference resistance elements 4 and 7, the antiferromagnetic layer 21, the fixed magnetic layer 22, the free magnetic layer 24, the nonmagnetic conductive layer 23, and the protective layer 25 are laminated in this order from the side of the substrate 2.

The films of the reference resistance elements 4 and 7 and the variable resistance elements 5 and 6 are formed on the same substrate 2. Thus, the magnetization direction of the fixed magnetic layer 22 included in each of the reference resistance elements 4 and 7 illustrated in FIG. 2B is fixed in the direction of X2, in a similar manner as in the variable resistance elements 5 and 6 illustrated in FIG. 2A. In each of the reference resistance elements 4 and 7, however, the free magnetic layer 24 is directly superimposed on the fixed magnetic layer 22. Thus, even if the element is acted upon by the external magnetic field, the overall resistance value of the element does not change.

Further, the reference resistance elements 4 and 7 are the same as the variable resistance elements 5 and 6 in layer structure and film thickness. Therefore, a characteristic change caused by an ambient temperature change or the like can be made equal between the reference resistance elements 4 and 7 and the variable resistance elements 5 and 6.

The first resistance adjusting unit 3 and the second resistance adjusting unit 8 are the same in structure and planer pattern shape. The first resistance adjusting unit 3 is provided between a leading end 4a of the first reference resistance element 4 and a basal end 12a1 of the lead layer 12a, while the second resistance adjusting unit 8 is provided between a leading end 7a of the second reference resistance element 7 and a basal end 13a of the earth terminal 13.

The first resistance adjusting unit 3 and the second resistance adjusting unit 8 are the same in structure. Thus, only of the first resistance adjusting unit 3 is described below, and description of the second resistance adjusting unit 8 will be omitted. The components of the second resistance adjusting unit 8 will be denoted with the same reference numerals as the reference numerals used to denote the components of the first resistance adjusting unit 3.

The first resistance adjusting unit 3 includes a first resistive layer 31 and a second resistive layer 32, which extend parallel to each other. The first resistive layer 31 and the second resistive layer 32 are the same in width, thickness, and overall length. The first resistance adjusting unit 3 is the same in lamination structure as the first reference resistance element 4 and the second reference resistance element 7 illustrated in FIG. 2B. Further, the respective layers forming the first resistance adjusting unit 3 are the same in thickness as the respective layers forming each of the first reference resistance element 4 and the second reference resistance element 7.

As illustrated in FIG. 1, the first resistance adjusting unit 3 includes conductive layers 33a, 33b, 33c, 33d, 33e, 33f, and 33g to establish conduction between the first resistive layer 31 and the second resistive layer 32. The conductive layers 33a, 33b, 33c, 33d, 33e, 33f, and 33g are formed of conductive ink or the like containing copper, silver, gold, or conductive filler including silver or gold. The specific resistance of the conductive layers 33a, 33b, 33c, 33d, 33e, 33f, and 33g is substantially lower than the average specific resistance of the first resistive layer 31 and the second resistive layer 32. Further, the power supply terminal 11, the lead layers 12a and 12b, the earth terminal 13, the first output terminal 14, and the second output terminal 15 are also formed of a conductive material having a substantially low specific resistance. The conductive layers 33a, 33b, 33c, 33d, 33e, 33f, and 33g may be formed of the same conductive material as the conductive material forming the respective terminals 11, 13, 14, and 15 and the lead layers 12a and 12b.

As illustrated in FIG. 3, between the conductive layers 33a and 33b, a resistance element R1 is formed by a part of the first resistive layer 31, and another resistance element R1 is formed by a part of the second resistive layer 32. That is, a parallel portion including the parallel connected resistance elements R1 and R1 is formed between the conductive layers 33a and 33b. Further, between the conductive layers 33b and 33c, resistance elements R2 and R2 are formed by the first resistive layer 31 and the second resistive layer 32, respectively, and the mutually parallel resistance elements R2 and R2 form another parallel portion.

In a similar manner, a parallel portion including parallel connected resistance elements R3 and R3 is formed between the conductive layers 33c and 33d, and a parallel portion including parallel connected resistance elements R4 and R4 is formed between the conductive layers 33d and 33e. Further, a parallel portion including parallel connected resistance elements R5 and R5 is formed between the conductive layers 33e and 33f, and a parallel portion including parallel connected resistance elements R6 and R6 is formed between the conductive layers 33f and 33g. In the first resistance adjusting unit 3, the respective parallel portions from the parallel portion including the resistance elements R1 and R1 to the parallel portion including the resistance elements R6 and R6 are connected in series.

Each pair of the resistance elements R1 and R1 to R6 and R6 is formed by a part of the first resistive layer 31 and a part of the second resistive layer 32, which have the same width and film thickness. Thus, the resistance elements R1 and R1 forming the same parallel portion have the same resistance value. Similarly, the resistance value is the same between the two resistance elements forming each of the parallel portions, i.e., between the resistance elements R2 and R2, between the resistance elements R3 and R3, between the resistance elements R4 and R4, between the resistance elements R5 and R5, and between the resistance elements R6 and R6.

Further, the above-described conductive layers for establishing conduction between the first resistive layer 31 and the second resistive layer 32 are disposed at different intervals. The interval between the conductive layers 33b and 33c is twice as long as the interval between the conductive layers 33a and 33b. Further, the interval between the conductive layers 33c and 33d is twice as long as the interval between the conductive layers 33b and 33c. Similarly, the interval between the conductive layers 33e and 33f is twice as long as the interval between the conductive layers 33d and 33e.

As a result, the resistance value of the resistance element R2 is twice as great as the resistance value of the resistance element R1. Further, the resistance value of the resistance element R3 is twice as great as the resistance value of the resistance element R2, and the resistance value of the resistance element R4 is twice as great as the resistance value of the resistance element R3. Furthermore, the resistance value of the resistance element R5 is twice as great as the resistance value of the resistance element R4, and the resistance value of the resistance element R6 is twice as great as the resistance value of the resistance element R5.

FIG. 4 illustrates a circuit configuration of the first resistance adjusting unit 3. In the present embodiment, the resistance values of the resistance elements R1, R2, R3, R4, R5, and R6 are 10Ω, 20Ω, 40Ω, 80Ω, 160Ω, and 320Ω, respectively. Therefore, the combined resistance of the parallel portion including the resistance elements R1 and R1 is 5Ω, and the combined resistance of the parallel portion including the resistance elements R2 and R1 is 10Ω. Further, the combined resistance of the parallel portion including the resistance elements R3 and R3 is 20Ω, and the combined resistance of the parallel portion including the resistance elements R4 and R4 is 40Ω. Furthermore, the combined resistance of the parallel portion including the resistance elements R5 and R5 is 80Ω, and the combined resistance of the parallel portion including the resistance elements R6 and R6 is 160Ω. That is, the combined resistance is sequentially doubled from one to the next of the parallel portions in the serial direction.

As illustrated in FIG. 3, the second resistance adjusting unit 8 is the same as the first resistance adjusting unit 3 in the configuration of the resistance elements R1 to R6.

In the present magnetic detection device 1, a positive potential is supplied from a power supply to the power supply terminal 11, and the earth terminal 13 is grounded. When the magnetic detection device 1 is not approached by a magnetic field, the resistance value of the first variable resistance element 5 and the resistance value of the second variable resistance element 6 are both at the lowest value. In this case, a midpoint potential obtained from the output terminal 14 is minimized, while a midpoint potential obtained from the output terminal 15 is maximized.

If the magnetic detection device 1 is approached by a magnet, and thus if the magnetic field directed in the direction of X1 is increased, the direction of the magnetic field of the free magnetic layer 24 included in each of the first variable resistance element 5 and the second variable resistance element 6 is directed in the direction of X1. Thus, the resistance value of the first variable resistance element 5 and the resistance value of the second variable resistance element 6 are maximized. As a result, the midpoint potential of the output terminal 14 and the midpoint potential of the output terminal 15 are both maximized. If the difference between the potential of the output terminal 15 and the potential of the output terminal 14 is taken by using a differential amplifier, for example, a detection output of a wide variation range can be obtained. When the output from the differential amplifier exceeds a predetermined threshold value, the approach of the magnet can be detected.

To keep the change of the potential output from the output terminal 14 and the change of the potential output from the output terminal 15 within a predetermined standard range in consideration of the relationship of the changes with the threshold value, it is necessary to appropriately adjust the balance between the resistance value of the first variable resistance element 5 and the resistance value of the fixed resistor connected in series to the first variable resistance element 5. When there is no action by the external magnetic field, for example, if the potential of each of the output terminals 14 and 15 is set to be one half a power supply voltage, the output from the differential amplifier can be made zero when there is no action by the external magnetic field.

In the present magnetic detection device 1, the potential output from the output terminal 14 can be adjusted by adjusting the resistance value of the first resistance adjusting unit 3. Further, the potential output from the output terminal 15 can be adjusted by adjusting the resistance value of the second resistance adjusting unit 8.

The resistance value of each of the first variable resistance element 5 and the second variable resistance element 6 is approximately 1 kΩ to 3 kΩ when no magnetic field is provided. The variation of the resistance value is approximately ±10%. In the present embodiment, the design value of the resistance value of each of the first variable resistance element 5 and the second variable resistance element 6 is 2 kΩ when no magnetic field is provided, and the variation of the resistance value is approximately ±200Ω. Further, the resistance value of each of the first reference resistance element 4 and the second reference resistance element 7 is set to be approximately 1.5 kΩ.

In the state as illustrated in FIG. 1 in which the films of the first resistance adjusting unit 3 and the second resistance adjusting unit 8 are not trimmed, the sum of the combined resistance values of each of the resistance adjusting units is 315Ω. Further, the maximum adjustment range of each of the first resistance adjusting unit 3 and the second resistance adjusting unit 8 is 315Ω. Therefore, the design value of the combined resistance value of the first reference resistance element 4 and the first resistance adjusting unit 3 is 1815 to 2130Ω. Similarly, the design value of the combined resistance value of the second reference resistance element 7 and the second resistance adjusting unit 8 is 1815 to 2130Ω. In addition, each of the first resistance adjusting unit 3 and the second resistance adjusting unit 8 can change the resistance value thereof by the unit of 5Ω.

In this manner, it is possible to obtain a wide adjustment range of the resistance values in each of the first reference resistance element 4 and the second reference resistance element 7. Further, when there is no action by the magnetic filed, the voltage output from each of the output terminals 14 and 15 can be easily adjusted to one half the power supply voltage, for example, by adjusting the resistance value by the unit of 5Ω.

Figure 5:
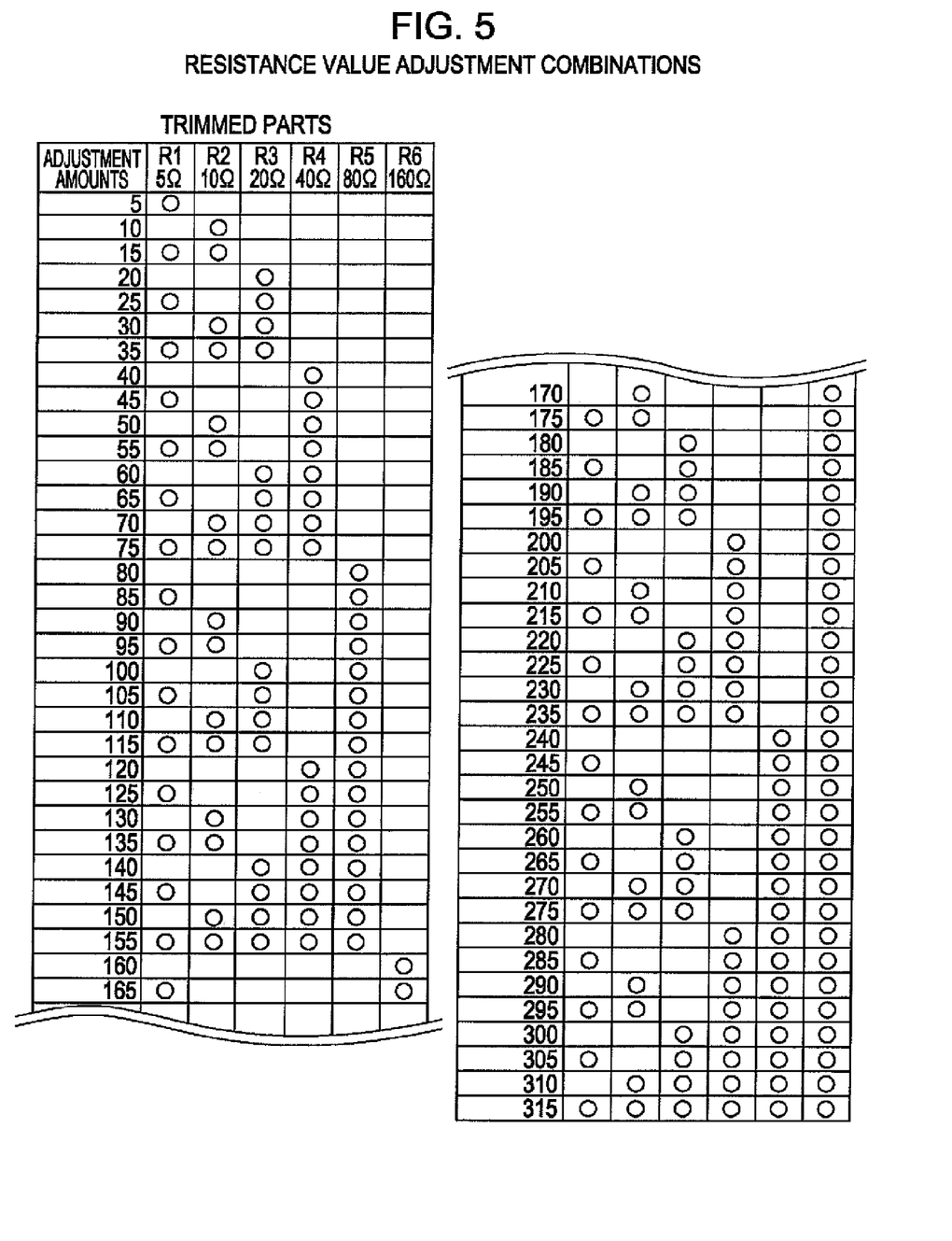
FIG. 5 is an explanatory diagram illustrating adjustment phases and adjustment ranges of the resistance adjusting unit.

FIG. 5 shows, in a table, adjustment amounts of the resistance value in each of the first resistance adjusting unit 3 and the second resistance adjusting unit 8.

The leftmost column of FIG. 5 indicates the adjustment amounts of the resistance value in each of the first resistance adjusting unit 3 and the second resistance adjusting unit 8. For example, the adjustment amount is 5Ω in the uppermost row of the table. This means that the resistance value is increased by 5Ω. Meanwhile, the adjustment amount is 315Ω in the lowermost row of the table. This means that the resistance value is increased by 315Ω. Further, the mark "○" appearing in the table indicates that a resistance element forming a parallel portion is brought into the non-conduction state. That is, the uppermost row of the table indicates that only one of the resistance elements R1 and R1 forming a parallel portion is brought into the non-conduction state. Meanwhile, the lowermost row of the table indicates that one of the resistance elements R1 and R1, one of the resistance elements R2 and R2, one of the resistance elements R3 and R3, one of the resistance elements R4 and R4, one of the resistance elements R5 and R5, and one of the resistance elements R6 and R6, which form the respective parallel portions, are brought in the non-conduction state.

As illustrated in FIG. 5, if only one of the resistance elements R1 and R1 forming a parallel portion is brought into the non-conduction state, for example, the resistance value of the first resistance adjusting unit 3 or the second resistance adjusting unit 8 can be increased by 5Ω. Further, if one of the resistance elements R1 and R1, one of the resistance elements R2 and R2, and one of the resistance elements R3 and R3 are respectively brought into the non-conduction state, the resistance value can be increased by 35Ω. Furthermore, as in the lowermost row, if one of the resistance elements R1 and R1, one of the resistance elements R2 and R2, one of the resistance elements R3 and R3, one of the resistance elements R4 and R4, one of the resistance elements R5 and R5, and one of the resistance elements R6 and R6 are brought in the non-conduction state, the resistance value can be increased by 315Ω.

In this manner, the resistance value can be changed by the unit of 5Ω by bringing only one of the resistance elements included in each of the parallel portions into the non-conduction state and by combining the resistance elements to be brought into the non-conduction state.

One of the resistance elements R1 and R1 can be brought into the non-conduction state by cutting off either one of the first resistive layer 31 and the second resistive layer 32 between the conductive layers 33a and 33b, for example. The same applies to the cases of the other resistance elements R2 and R2 to R6 and R6.

The method of cutting off either one of the first resistive layer 31 and the second resistive layer 32 includes cutoff using laser light, cutoff by milling, and cutoff by a photolithographic method, for example. Generally, the magnetic detection device 1 illustrated in FIG. 1 is obtained by forming a plurality of the magnetic detection devices 1 of thin films on a common substrate and thereafter cutting the thus formed devices into individual pieces. Thus, the magnetic detection devices 1 formed in the same area on the same substrate have very similar characteristics. Therefore, after monitoring one of the magnetic detection devices 1 formed on the same substrate and then determining which one of the resistance elements should be cut off, the adjustment operation of adjusting the resistance value can be performed in a single process on the plurality of the magnetic detection devices 1 according to any one of the above-described methods.

Alternatively, as the method of bringing one of the resistance elements R1 and R1 into the non-conduction state, the conductive layers 33a and 33b may be formed to be connected to each other on a surface of either one of the first resistive layer 31 and the second resistive layer 32, for example.

Further, the first resistance adjusting unit 3 may be disposed between the earth terminal 13 and the output terminal 14, instead of being disposed at the position shown in FIG. 3. Alternatively, the first resistance adjusting unit 3 may be provided both at the position shown in FIG. 3 and between the earth terminal 13 and the output terminal 14. Similarly, the second resistance adjusting unit 8 may be disposed between the power supply terminal 11 and the output terminal 15, instead of being disposed at the position shown in FIG. 3. Alternatively, the second resistance adjusting unit 8 may be provided both at the position shown in FIG. 3 and between the power supply terminal 11 and the output terminal 15.

What is claimed is:

1. A magnetic detection device comprising:
a variable resistance element having an electrical resistance changed by an external magnetic field, and
a reference resistance element having an electrical resistance unchanged by the external magnetic field, and serially connected to the variable resistance element, and applied with a direct current voltage to detect a midpoint potential between the variable resistance element and the reference resistance element,
wherein at least one of the variable resistance element and the reference resistance element is serially connected to a resistance adjusting unit, including a plurality of serially connected parallel portions having a plurality of parallel connected resistance elements that are different from each other in combined resistance value, and
wherein the sum of the combined resistance values of the resistance adjusting unit is adjusted by bringing any one of the resistance elements into a non-conduction state.

2. The magnetic detection device according to claim 1, wherein the resistance adjusting unit includes a plurality of resistive layers extending parallel to each other and connected to each other by conductive layers at a plurality of positions, and portions of the resistive layers sandwiched between an adjacent pair of the conductive layers form the resistance elements forming one of the parallel portions,
wherein the parallel portions differ from each other in combined resistance value by differently setting intervals between the conductive layers, and
wherein the sum of the combined resistance values of the resistance adjusting unit is adjusted by disconnecting the resistance element at a position between the adjacent pair of the conductive layers.

3. The magnetic detection device according to claim 2, wherein the variable resistance element is a magnetoresistance effect element, and each of the resistive layers forming the resistance adjusting unit is formed of the same film materials as film materials forming the magnetoresistance effect element, and a lamination order of the film materials is configured to prevent the resistance value thereof from being changed by the external magnetic field.

4. The magnetic detection device according to claim 1, wherein each of the parallel portions is configured such that the plurality of the resistance elements are the same in resistance value, and the combined resistance value thereof is increased in a phased manner in the serial direction of the resistance adjusting unit.

5. The magnetic detection device according to claim 4, wherein the combined resistance value of one of a pair of the parallel portions adjacent to each other in the serial direction is twice as great as the combined resistance value of the other one of the pair.

* * * * *